US006392913B1

(12) United States Patent
Sandhu

(10) Patent No.: US 6,392,913 B1
(45) Date of Patent: May 21, 2002

(54) METHOD OF FORMING A POLYSILICON DIODE AND DEVICES INCORPORATING SUCH DIODE

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/549,454

(22) Filed: Apr. 14, 2000

Related U.S. Application Data

(62) Division of application No. 09/372,503, filed on Aug. 11, 1999, now Pat. No. 6,229,157, which is a division of application No. 08/665,325, filed on Jun. 18, 1996, now Pat. No. 6,025,220.

(51) Int. Cl.[7] .................. H01L 29/04; H01L 29/861; G11C 17/06
(52) U.S. Cl. .................. 365/105; 257/64; 257/653; 257/390; 257/520; 257/75
(58) Field of Search .............. 257/75, 64, 653, 257/390, 520; 365/105

(56) References Cited

U.S. PATENT DOCUMENTS

| 3,423,646 A | 1/1969 | Cubert et al. ........... 317/234 |
| 3,796,926 A | 3/1974 | Cole et al. ............. 317/234 R |
| 4,099,260 A | 7/1978 | Lynes et al. ........... 365/105 |

(List continued on next page.)

FOREIGN PATENT DOCUMENTS

| EP | 0 117 045 | 8/1984 | ........... H01L/45/00 |
| GB | 1 319 388 | 6/1973 | ........... H01L/9/00 |
| JP | 60109266 | 6/1985 | ........... H01L/27/10 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.
Pein and Plummer, "Performance of the 3–D Sidewall Flash EPROM Cell," *IEEE*, 11–14, 1993.
Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.
Post et al., "Polysilicon Emitters for Bipolar Transistors: A Review and Re–Evaluation of Theory and Experiment," *IEEE*, 39(7):1717–1731, 1992.
Post and Ashburn, "The Use of an Interface Anneal to Control the Base Current and Emitter Resistance of p–n–p Polysilicon Emitter Bipolar Transistors," *IEEE*, 13(8):408–410, 1992.
Rose et al., "Amorphous Silicon Analogue Memory Devices," *J. Non–Crystalline Solids*, 115:168–170, 1989.
Schaber et al., "Laser Annealing Study of the Grain Size Effect in Polycrystalline Silicon Schottky Diodes," *J. Appl. Phys.*, 53(12):8827–8834, 1982.
Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

(List continued on next page.)

*Primary Examiner*—Jerome Jackson, Jr.
(74) *Attorney, Agent, or Firm*—Fletcher, Yoder & Van Someren

(57) ABSTRACT

A method for manufacturing a diode having a relatively improved on-off ratio. The diode is formed in a container in an insulative structure layered on a substrate of an integrated circuit. The container is then partially filled with a polysilicon material, by methods such as conformal deposition, leaving a generally vertical seam in the middle of the polysilicon material. An insulative material is deposited in the seam. The polysilicon material is appropriately doped and electrical contacts and conductors are added as required. The diode can be coupled to a chalcogenide resistive element to create a chalcogenide memory cell.

16 Claims, 5 Drawing Sheets

U.S. PATENT DOCUMENTS

| | | | |
|---|---|---|---|
| 4,115,872 A | 9/1978 | Bluhm | 365/163 |
| 4,174,521 A | 11/1979 | Neale | 357/45 |
| 4,194,283 A | 3/1980 | Hoffmann | 29/571 |
| 4,203,123 A | 5/1980 | Shanks | 357/2 |
| 4,227,297 A | 10/1980 | Angerstein | 29/571 |
| 4,272,562 A | 6/1981 | Wood | 427/87 |
| 4,458,260 A | 7/1984 | McIntyre et al. | 357/30 |
| 4,499,557 A | 2/1985 | Holmberg et al. | 365/163 |
| 4,502,208 A | 3/1985 | McPherson | 29/584 |
| 4,502,914 A | 3/1985 | Trumpp et al. | 156/643 |
| 4,569,698 A | 2/1986 | Feist | 148/1.5 |
| 4,630,355 A | 12/1986 | Johnson | 29/575 |
| 4,642,140 A | 2/1987 | Noufi et al. | 148/6.24 |
| 4,666,252 A | 5/1987 | Yaniv et al. | 350/333 |
| 4,677,742 A | 7/1987 | Johnson | 29/591 |
| 4,715,109 A | 12/1987 | Bridges | 437/200 |
| 4,757,359 A | 7/1988 | Chiao et al. | 357/23.5 |
| 4,795,657 A | 1/1989 | Formigoni et al. | 427/96 |
| 4,804,490 A | 2/1989 | Pryor et al. | 252/62.3 BT |
| 4,809,044 A | 2/1989 | Pryor et al. | 357/2 |
| 4,823,181 A | 4/1989 | Mohsen et al. | 357/51 |
| 4,876,220 A | 10/1989 | Mohsen et al. | 437/170 |
| 4,876,668 A | 10/1989 | Thakoor et al. | 365/163 |
| 4,881,114 A | 11/1989 | Mohsen et al. | 357/54 |
| 4,892,840 A | 1/1990 | Esquivel et al. | 437/52 |
| 5,144,404 A | 9/1992 | Iranmanesh et al. | 357/51 |
| 5,166,096 A | 11/1992 | Cote et al. | 437/195 |
| 5,166,758 A | 11/1992 | Ovshinsky et al. | 257/3 |
| 5,177,567 A | 1/1993 | Klersy et al. | 257/4 |
| 5,236,863 A | 8/1993 | Iranmanesh | 437/90 |
| 5,250,461 A | 10/1993 | Sparks | 437/67 |
| 5,293,335 A | 3/1994 | Pernisz et al. | 365/148 |
| 5,296,716 A | 3/1994 | Ovshinsky et al. | 257/3 |
| 5,308,783 A | 5/1994 | Krautschneider et al. | 437/52 |
| 5,310,693 A | 5/1994 | Hsue | 437/43 |
| 5,316,978 A | 5/1994 | Boyd et al. | 437/203 |
| 5,335,219 A | 8/1994 | Ovshinsky et al. | 369/288 |
| 5,341,328 A | 8/1994 | Ovshinsky et al. | 365/163 |
| 5,359,205 A | 10/1994 | Ovshinsky | 257/3 |
| 5,363,329 A | 11/1994 | Troyan | 365/184 |
| 5,414,271 A | 5/1995 | Ovshinsky et al. | 257/3 |
| 5,429,988 A | 7/1995 | Huang et al. | 437/187 |
| 5,510,629 A | 4/1996 | Karpovich et al. | 257/50 |
| 5,534,711 A | 7/1996 | Ovshinsky et al. | 257/3 |
| 5,534,712 A | 7/1996 | Ovshinsky et al. | 217/3 |
| 5,536,947 A | 7/1996 | Klersy et al. | 257/3 |
| 5,583,348 A | 12/1996 | Sundaram | 257/73 |
| 5,687,112 A | 11/1997 | Ovshinsky | 365/163 |
| 5,700,712 A | 12/1997 | Schwalke | 437/62 |
| 5,714,768 A | 2/1998 | Ovshinsky et al. | 257/40 |
| 5,714,795 A | 2/1998 | Ohmi et al. | 257/530 |
| 5,751,012 A | 5/1998 | Wolstenholme et al. | 257/5 |
| 5,789,758 A | 8/1998 | Reinberg | 257/3 |
| 5,841,150 A | 11/1998 | Gonzalez et al. | 257/3 |

OTHER PUBLICATIONS

Yeh et al., "Investigation of Thermal Coefficient for Polycrystalline Silicon Thermal Sensor Diode," *Jp. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

METHOD OF FORMING A POLYSILICON DIODE AND DEVICES INCORPORATING SUCH DIODE

This application is a Divisional of application Ser. No. 09/372,503, filed on Aug. 11, 1999, now U.S. Pat. No. 6,229,157, which is a Divisional of application Ser. No. 08/665,325, filed on Jun. 18, 1996, which issued as U.S. Pat. No. 6,025,220 on Feb. 15, 2000.

BACKGROUND OF THE INVENTION

The present invention relates generally to a process for making a compact and low-leakage diode, and more specifically relates to a process for making a polysilicon-based diode having a relatively high ratio between the resistance to forward conduction and the resistance to rearward conduction; i.e., the diode on/off ratio. One exemplary preferred implementation of this diode is in a chalcogenide-based memory array in an integrated circuit.

Chalcogenide materials have recently been proposed to form memory cells in memory devices. As is known to those skilled in the art, a memory device can have a plurality of memory arrays, and each memory array can include hundreds of thousands of memory cells. Each memory cell generally includes a memory element and an access device, such as a diode, coupled to the memory element. The chalcogenide materials store information by changing resistivity. Generally speaking, chalcogenides are materials which may be electrically stimulated to chance states, from an amorphous state to a crystalline state, for example, or to exhibit different resistivities while in the crystalline state. Thus, chalcogenide memory elements can be utilized in memory devices for the storage of binary data, or of data represented in higher based systems. Such memory cells will typically include a cell accessible, for example, by a potential applied to access lines, in a manner as conventionally used in memory devices. Typically, the cell will include the chalcogenide element as a resistive element, and will include an access or isolation device coupled to the chalcogenide element. In one exemplary implementation suitable for use in a random access memory (RAM), the access device will be a diode of the structure disclosed herein.

Many chalcogenide alloys may be contemplated for use with the present invention. For example, alloys of tellurium, antimony and germanium may be particularly desirable, and alloys having from approximately 55–85 percent tellurium and on the order of 15–25 percent germanium are currently contemplated for use in chalcogenide memory cell devices. U.S. Pat. No. 5,335,219 is believed to be generally illustrative of the existing state of the art relative to chalcogenide materials, and is believed to provide explanations regarding the current theory of function and operation of chalcogenide elements and their use in memory cells. The specification of U.S. Pat. No. 5,335,219 to Ovshinski et al., issued Aug. 2, 1994, is incorporated herein by reference, for all purposes. An exemplary specific chalcogenide alloy suitable for use in memory cells in accordance with the present invention is one consisting of $Te_{56}Ge_{22}Sb_{22}$.

A diode as disclosed herein is of use in many different applications. In the exemplary use of the diode in a chalcogenide memory cell, the attributes of the current device are especially significant. In a chalcogenide memory cell, it is desired that the diode have a lower forward resistance than the lowest possible resistance state of the chalcogenide element. Likewise, a preferred diode would have a hither reverse resistance than the highest resistance state of the chalcogenide elements. Given that chalcogenide elements having a broad range of resistance states are desired, there exists a need for a diode having a very high ratio of forward resistance to reverse resistance (on/off ratio). For example, a ratio on the order of 1,000,000:1 has been discussed as a desired goal.

Polysilicon based diodes have the potential for providing such a ratio. However, traditional polysilicon diodes have exhibited relatively high leakage due to grain boundaries which provide leakage paths. This occurs because current conducts along the grain boundaries. Accordingly, the need remains, for a low-leakage diode having a relatively high ratio of forward resistance to reverse resistance and for a method to manufacture such a diode. The present invention offers a novel polysilicon diode construction, and a method of manufacturing such a diode having an improved high on/off ratio and improved leakage resistance characteristics.

SUMMARY OF THE INVENTION

The present invention provides a new diode, which may be manufactured to exhibit improved resistance to leakage; and also encompasses memory cells incorporating such diode and their method of manufacture.

In accordance with the present invention, the diode will be formed in a volume of polysilicon material containing the p-n junction. The diode is constructed to promote current conduction through the diode along a path which is perpendicular to the grain boundaries in the polysilicon. This is accomplished by configuring the polysilicon through control of the deposition parameters to orient the grain boundaries in a predetermined orientation, and by forming the polysilicon to avoid deleterious conductive paths, and to control the direction of current flow through the diode.

In one particularly preferred implementation, the polysilicon material will be formed within a container, such as within a volume of an insulating material. Preferably, the polysilicon material will be formed so as to define a generally central void therein. In one particularly preferred implementation, the polysilicon element will include a first, generally solid portion; and will include a second, generally annular portion extending therefrom. Thus, viewed in vertical cross-section, such an embodiment exhibits a generally U-shaped cross through at least a portion of the polysilicon. By "annular", it is not intended to define that the second portion would be circular in shape, but that there would be an outer perimeter area of polysilicon which would extend around an opening. The opening is provided so as to preclude communication of grain boundaries, formed by the deposition of the polysilicon material, across the width of the container. This void or opening will be filled with a generally insulating material. A junction will be formed within the polysilicon, such as through doping of the polysilicon, in accordance with known techniques.

In one particularly advantageous implementation of the invention, the diode will be used in manufacturing memory devices, including memory cells, with such cells including a chalcogenide multiple resistive state element in electrical communication with the diode. In such a memory cell, the diode serves as the access device, and the improved on/off ratio of the diode as described herein may be used with substantial advantage.

DETAILED DESCRIPTION OF THE PREFERRED EMBODIMENTS

Figure 1:
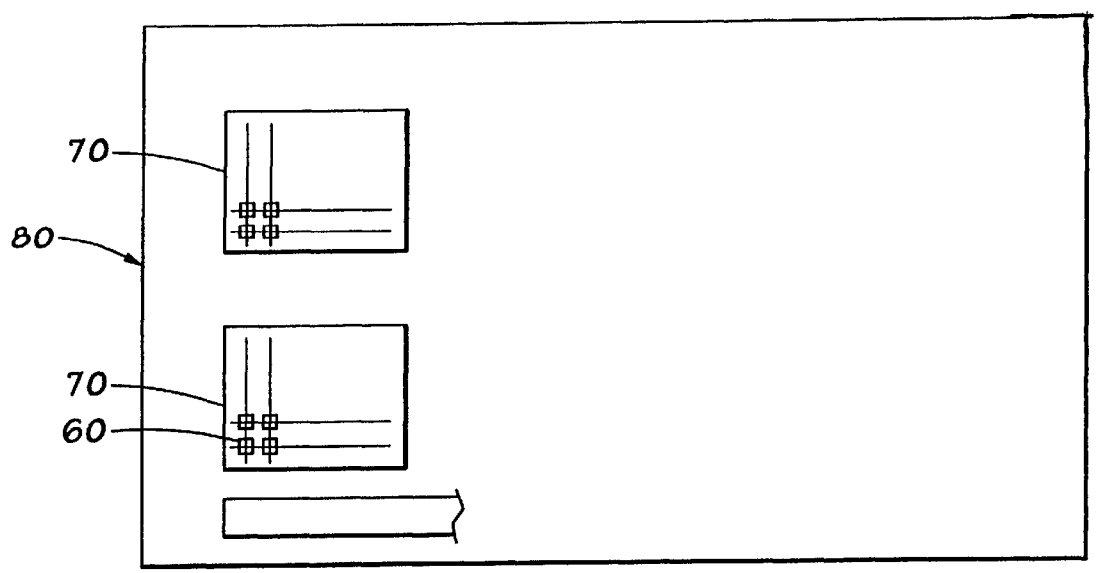
FIG. 1 is a functional illustration of a portion of a memory device including a plurality of memory cell arrays.
Figure 2:
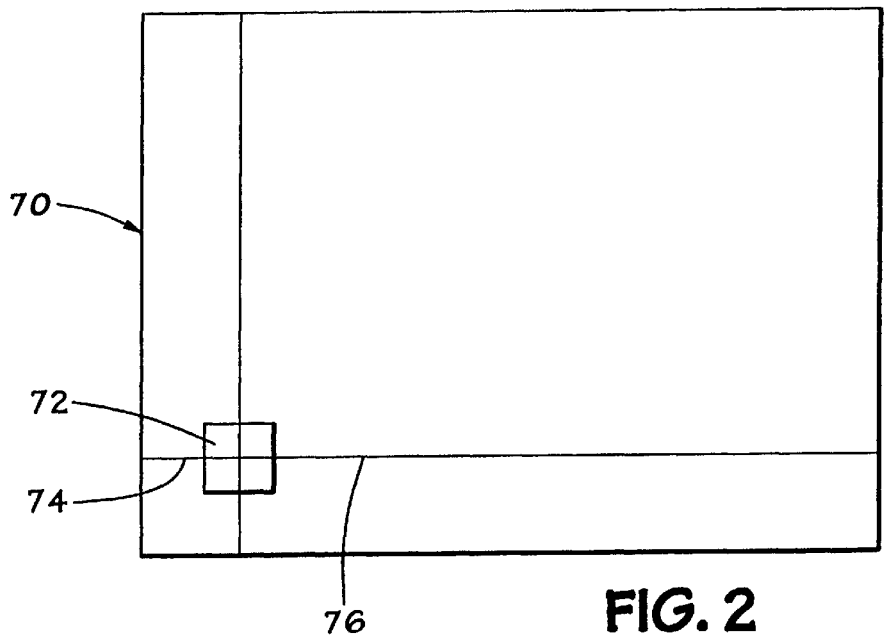
FIG. 2 is a functional illustration of one memory cell array of FIG. 1, including a chalcogenide memory cell.

Referring now to the drawings in more detail, and particularly to FIG. 1, therein is functionally depicted a memory device 80 having a plurality of memory arrays 70 contained therein. As is also seen in FIG. 2, each memory array 70 includes a plurality of memory cells 72, with each memory cell engaged by digit lines, in the form of a row or word line 74 and a column or bit line 76. Each memory cell 72 is accessed for reading or writing through a corresponding access or isolation device, by selecting the corresponding row and column coordinates of the individual memory cell 72.

Figure 3:
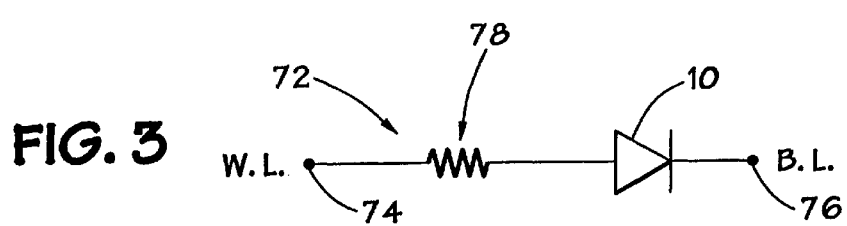
FIG. 3 is an schematic of the circuit of an exemplary memory cell of FIG. 2, including a chalcogenide resistive element coupled to a diode manufactured in accordance with the present invention.

Referring also to FIG. 3, therein is schematically illustrated an exemplary resistive-type memory device, such as a chalcogenide memory cell, having a resistive element 78, coupled in series with a diode access device 10. Chalcogenide element 78 is electrically coupled to a word line 74 while access diode 10 is electrically coupled to a bit line 76.

Figure 4:
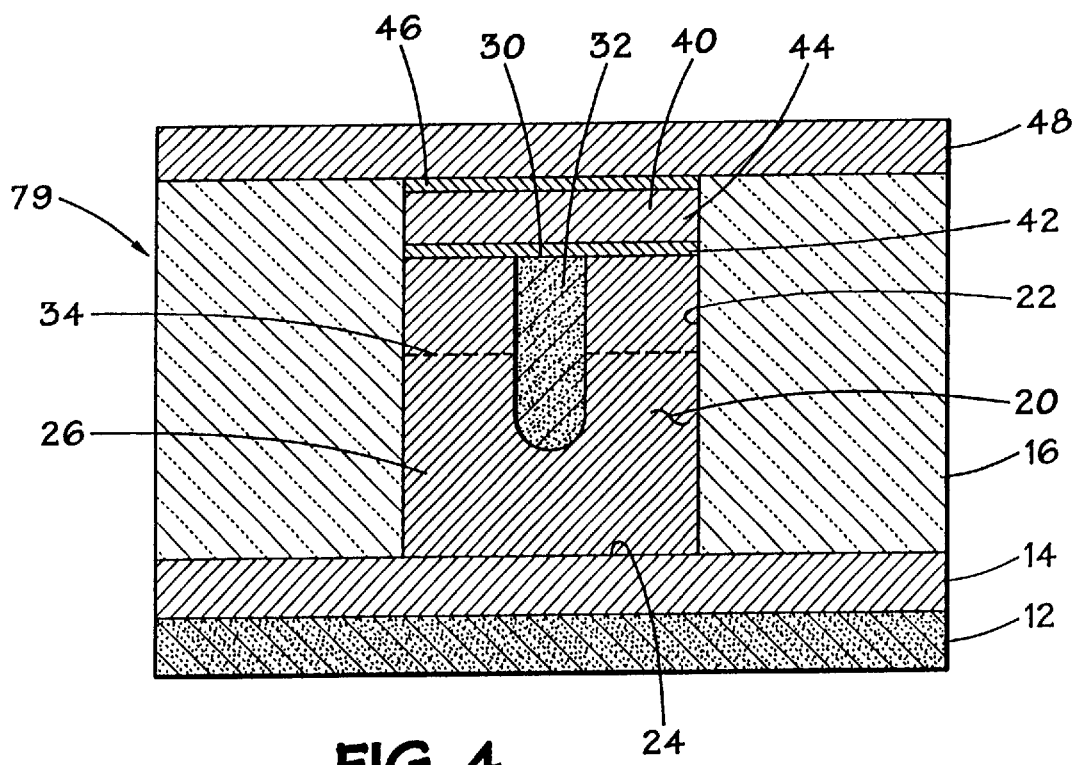
FIG. 4 depicts an exemplary diode in a memory cell in accordance with the present invention, illustrated in vertical section.
Figure 5:
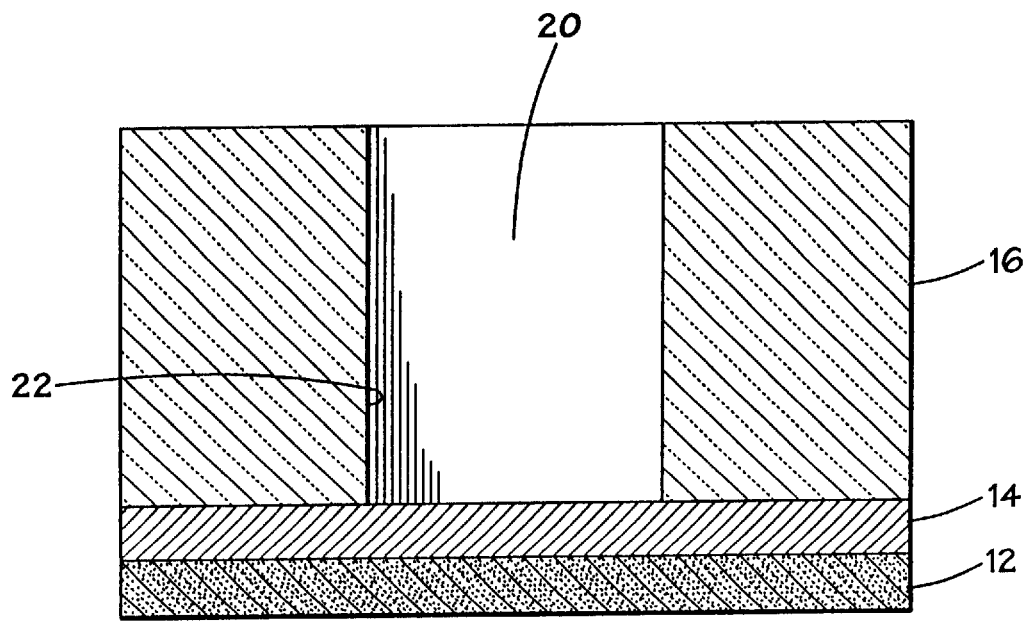
FIG. 5 depicts a container within an insulating layer suitable for containing a diode in accordance with the present invention, illustrated in vertical section.

Referring now to FIG. 4, therein is depicted, in vertical section, an exemplary memory cell including an exemplary polysilicon diode assembly 10 in accordance with the present invention. Subsequent figures, and the accompanying discussion, will be addressed to a method of manufacture of diode assembly 10. Diode assembly 10 is formed upon a substrate assembly 12. Substrate assembly 12 generally includes one or more supportive layers (not illustrated). Typically, such layers will be formed on a silicon substrate as a wafer for multiple integrated circuits. These layers may include multiple devices and/or conductors for the integrated circuits under construction. In the present embodiment, a conductive layer 14 is placed above substrate assembly 12. Conductive layer 14 can be a portion of an electrode, a buried contact, or a portion of another integrated circuit device formed in substrate assembly 12.

An insulative structure 16 is placed above conductive layer 14. In currently preferred embodiments, insulative layer 16 will typically be formed of insulating material such as boron-phosphorus silicon glass (BPSG). Insulative layer 16 includes a receptacle or container 20 formed as an aperture or recess within insulating layer 16. In a preferred embodiment, container 20 is shaped generally as a cylinder and measures approximately 0.5 micrometers in diameter and approximately 0.5 micrometers in depth. The size and shape of container 20 may be selected relative to the desired implementation. Container 20 is defined by sidewalls 22 and a bottom surface 24. As will be appreciated by those skilled in the art, container 20 could be formed as a portion of a trench assembly, or in other ways known in the art.

Container 20 is partially filled with a film of polysilicon material 26. Preferably, the polysilicon is formed as a generally conformal film, which leaves a generally centrally located void or seam 30 within polysilicon material 26 within container 20. The film of polysilicon material 26 may be deposited through an appropriate desired technique, such as, for example, low pressure chemical vapor deposition (LPCVD), through pyrolysis of silane ($SiH_4$). As is well-known, thin films of polycrystalline silicon typically include relatively small single crystal regions which are separated from one another by grain boundaries. Even if these grain boundaries do not exist in a polysilicon film at the time of deposition (i.e., a generally amorphous film, as deposited), subsequent processing steps common in the manufacture of semiconductor devices will typically raise the temperature of the polysilicon and cause formation of these grain boundaries. Typically, for optimized process conditions, a polysilicon film will include a generally columnar crystal grain structure which extends generally perpendicular to the surface on which deposition takes place; with the grain boundaries also, therefore, extending generally perpendicular to the surface upon which the deposition takes place.

Figure 6:
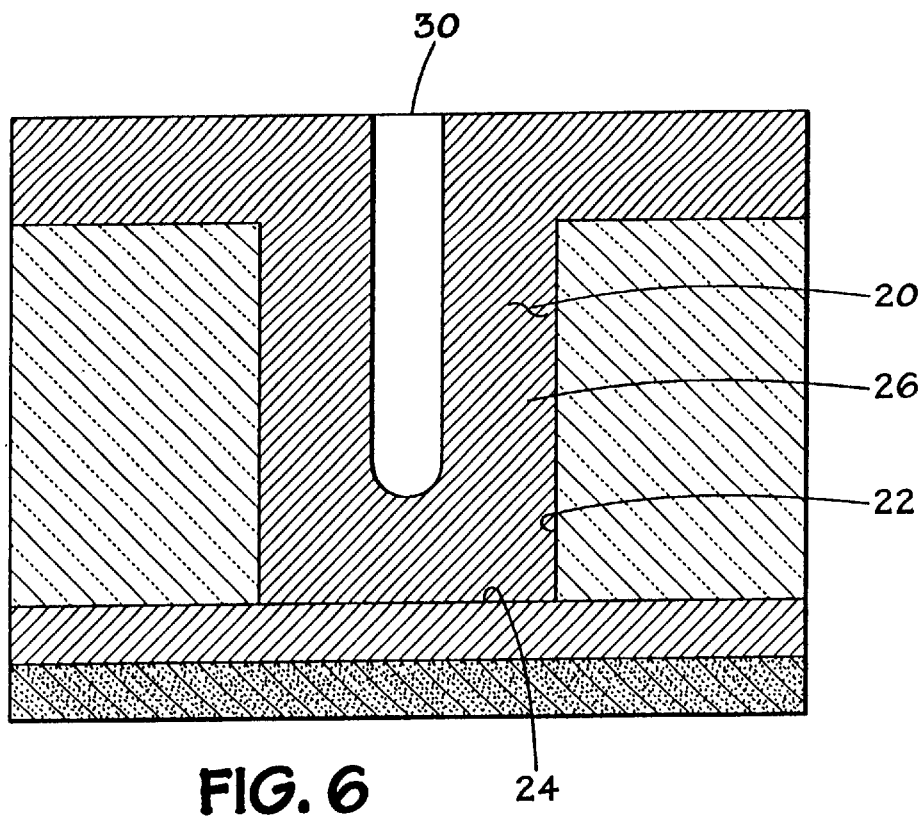
FIG. 6 depicts the container of FIG. 5, after formation of a polysilicon layer therein, illustrated in vertical section.

As depicted in FIG. 6, in the exemplary embodiment, polycrystalline film 26 has been deposited as a generally conformal layer, with the depth of the layer selected relative to the dimension across the width of container 20 so as to define a central seam or void 30 generally within the center of container 20. In one exemplary implementation, wherein container 20 is approximately 0.5 microns across, void 30 would preferably be approximately 0.15 to 0.17 microns across. Seam or void 30 will extend in a generally vertical direction, generally parallel to sidewalls 22 defining the side boundaries of container 20, and will extend along a portion of the height of container 20.

Figure 7:
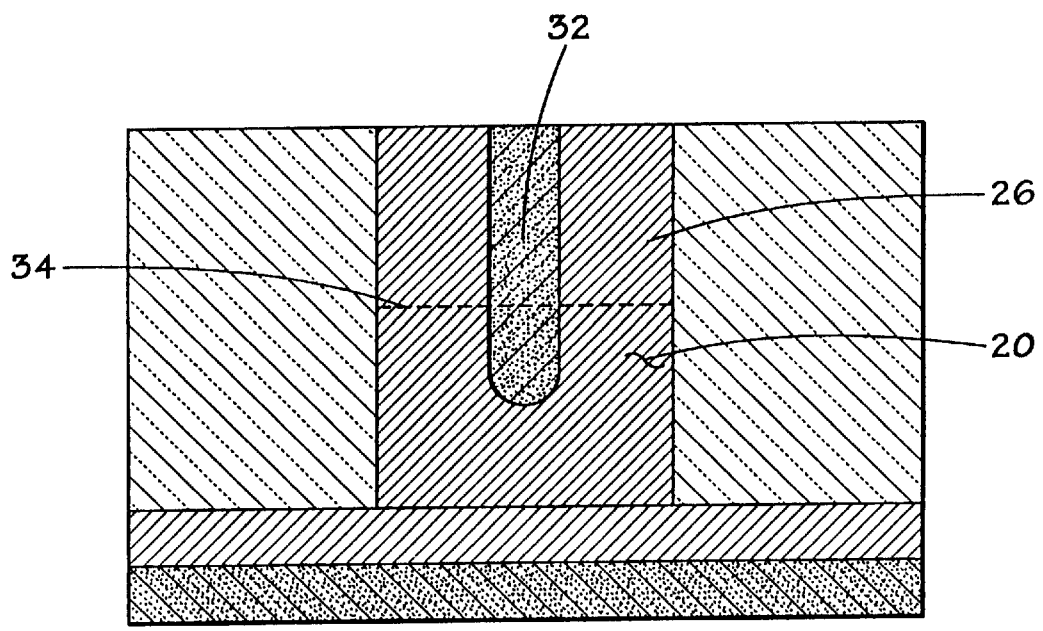
FIG. 7 depicts the structure of FIG. 6, after deposition of an insulating layer, also depicted in vertical section.

As depicted in FIG. 7, seam or void 30 is preferably filled with an insulating material 32. Preferably, an insulating material such as silicon oxide or silicon nitride will be utilized to fill void 30. Insulating material 32 prevents electrical communication across the width of polysilicon film 26 within container 20 by preventing electrical communication between the generally horizontally extending grain boundaries extending generally across the width of container 20, and thereby serves to isolate a conduction path through the polysilicon grain structure on one side of insulating material 32 from a conductive path on the opposite side of insulating material 32.

At some time, it will be necessary to dope polycrystalline layer 26 within container 20 to form a p-n junction 34. Preferably, this doping will be performed at least after polysilicon material extending above the upper surface 35 of insulator 16 is removed, such as by CMP or through conventional etching techniques. Additionally, it may be desirable to dope polysilicon after the deposition of insulating material 32 within void 30.

In one preferred embodiment, the doping will be accomplished by ion. implantation of the desired doping material, such as boron, phosphorous or arsenic, as desired for the specific implementation. In some applications, it may be possible to perform in situ doping of the polysilicon during the deposition process followed by ion implantation to form the junction. However, in most applications, preferred electrical properties for the diode of the current invention will be obtained through use of ion implantation.

Figure 8:
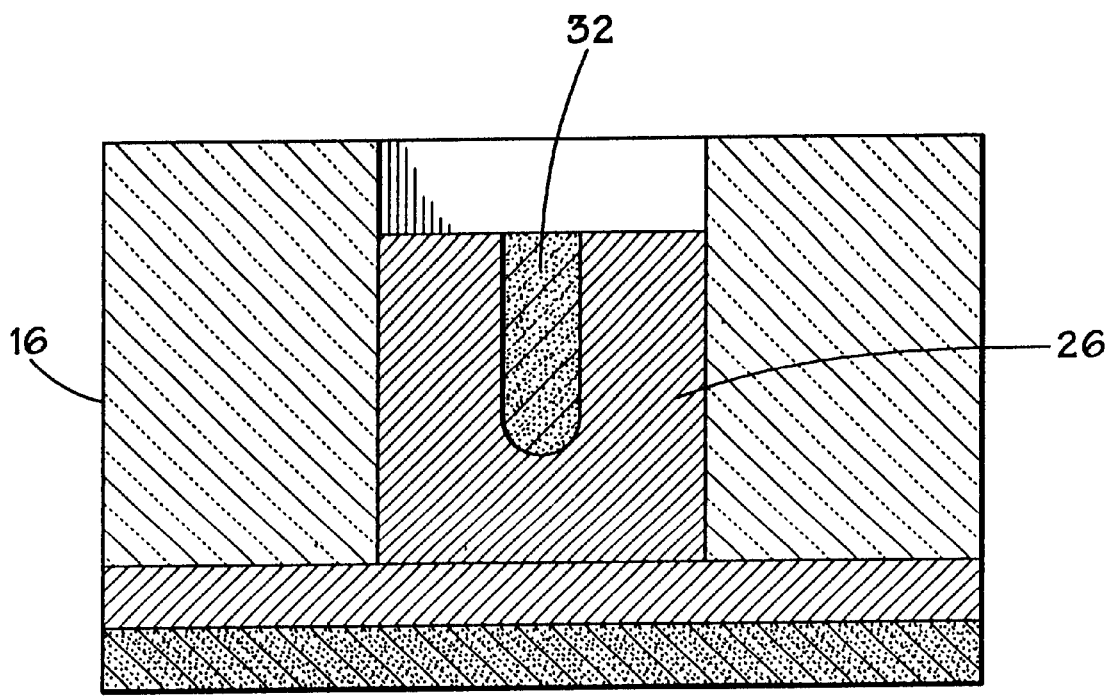
FIG. 8 depicts the structure of FIG. 7, after etching of the structure within the container, also illustrated in vertical section.

With the completion of the structure as depicted in FIG. 7, an exemplary diode in accordance with the present invention has been formed. In another specific implementation, however, it may be desirable to recess both polysilicon layer 26 and insulating material 32 within container 20, as depicted in FIG. 8, such as by etching. In this implementation, an entire chalcogenide cell may be formed within container 20, as depicted in FIG. 4. In this implementation, a chalcogenide element assembly layer 40 will be deposited within container 20, atop polysilicon diode 10. Chalcogenide memory element assembly 40 may include a plurality of layers, including a layer of a selected chalcogenide material. In a particularly envisioned implementation, memory element assembly 40 will include an electrode, such as a carbon layer 42, formed on top of diode 10, with a chalcogenide material layer 44 formed thereon. An optional diffusion barrier 46 may be formed atop the chalcogenide element, thereby completing the memory cell itself. Subsequently, as depicted in FIG. 4, another conductive layer 48, such as a digit line 74, 76, will be deposited above container 20, thereby completing a chalcogenide memory cell as schematically depicted in FIG. 3. Other structures may also be included with the memory cell 72, including an upper electrode, above chalcogenide layer 44. Additionally, spacers or other structures (not illustrated) to reduce the active area of chalcogenide exit 44 may also be included.

Figure 9:
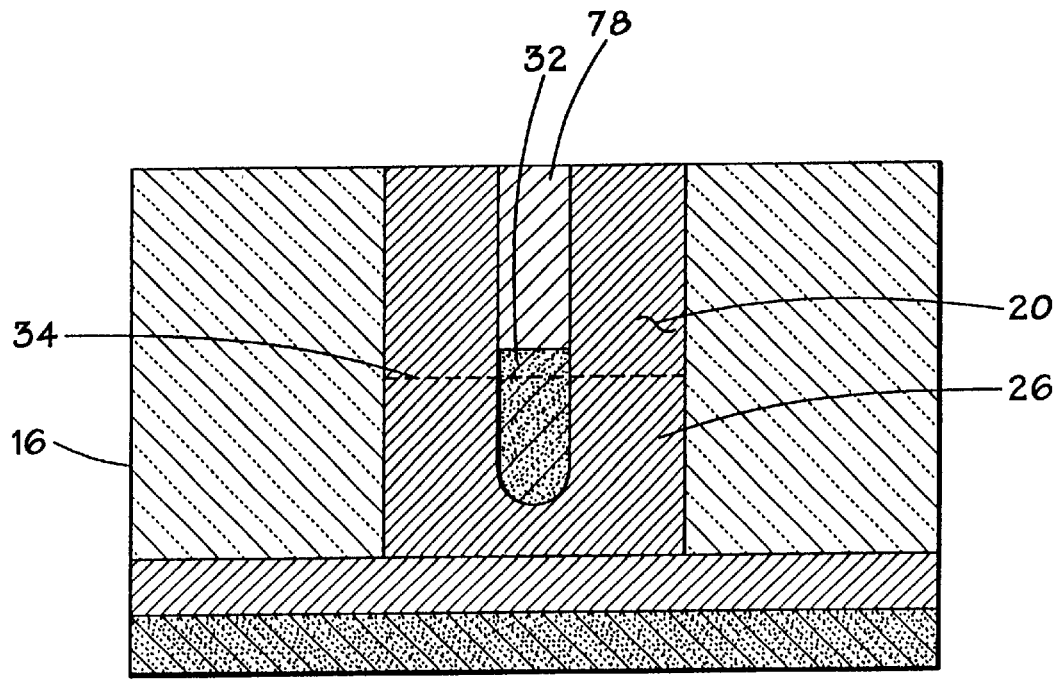
FIG. 9 depicts a structure similar to that of FIG. 7, but with the dielectric layer formed only within a portion of the central void, and with a volume of a conductive material within the void.

Referring now to FIG. 9, therein is depicted an alternative embodiment wherein a conductive element 78, such as either a chalcogenide element or an electrode (such as a metal contact) is located within void 30. In such embodiment, insulative filler 32 will only partially fill void 30, and conductive material 78 will fill another portion of void 30. Although depicted as being formed entirely within void 30, the conductive material 78 could be formed into void 30 and also extend above the upper surface of polysilicon 26 or insulative structure 16.

Figure 10:
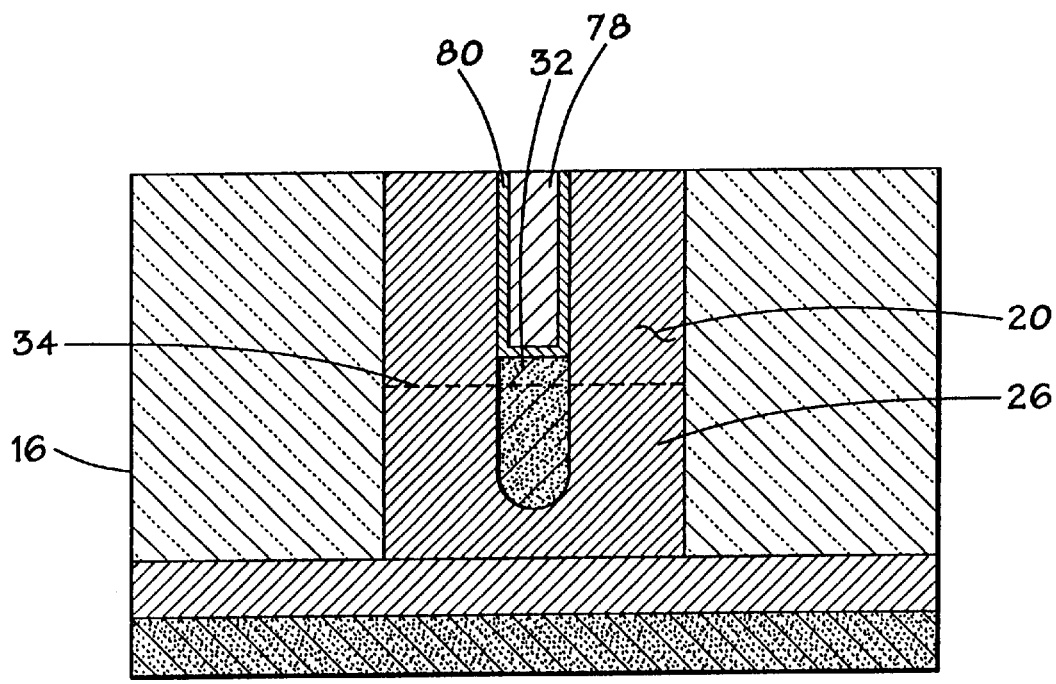
FIG. 10 depicts a structure similar to that of FIG. 9, but having a barrier layer disposed between said polysilicon and dielectric layers and the at least partially conductive material.

FIG. 10 depicts an embodiment similar to that depicted in FIG. 9, but with the additional inclusion of an appropriate barrier layer 80 between polysilicon 26 and the element formed of conductive material 78.

Many modifications and variations may be made in the techniques and structures described and illustrated herein without departing from the spirit and scope of the present invention. Accordingly, it should be clearly understood that the methods and embodiments described and illustrated herein are illustrative only, and are not to be considered as limitations upon the scope of the present invention.

What is claimed is:

1. An integrated circuit including a memory cell array, the memory cell array including a plurality of memory cells, comprising:
   a diode, comprising,
   an insulative material container structure having sidewalls,
   a polysilicon element within said container structure, said polysilicon element having grain boundaries generally perpendicular to the sidewalls of said container,
   an insulating material placed in the middle of the polysilicon element, essentially perpendicular to said grain boundaries, and
   one or more electrical contacts coupled to the polysilicon element; and
   a chalcogenide resistive element electrically coupled to one of said electrical contacts.

2. An integrated circuit diode comprising:
   a container having sidewalls;
   a layer of semiconductive material disposed on the sidewalls of the container to create a peripheral semiconductive member having a substantially central void; and
   a dopant disposed in the peripheral semiconductive member to create a diode.

3. The diode, as set forth in claim 2, wherein the container comprises:
   an insulative material disposed on a substrate, the container being formed in the insulative material.

4. The diode, as set forth in claim 2, wherein the container comprises a generally cylindrical opening formed in a substrate.

5. The diode, as set forth in claim 2, wherein the layer of semiconductive material within the container conformally covers the sidewalls and a bottom portion of the container.

6. The diode, as set forth in claim 2, comprising:
   a generally insulative material substantially filling the void.

7. The diode, as set forth in claim 2, comprising:
   a memory element in electrical contact with the peripheral semiconductive member.

8. The diode, as set forth in claim 7, wherein the memory element comprises:
   a first electrode in electrical contact with the peripheral semiconductive member;
   a layer of chalcogenide material over the first electrode; and
   a second electrode over the layer of chalcogenide material.

9. A memory cell comprising:
   a polysilicon diode having grain boundaries generally extending in a first direction, wherein current flows through the polysilicon diode in a second direction substantially perpendicular to the first direction; and
   a memory element coupled to the polysilicon diode.

10. The memory cell, as set forth in claim 9, wherein the polysilicon diode is disposed in a container formed in a dielectric layer of a substrate.

11. The memory cell, as set forth in claim 9, wherein the polysilicon diode comprises a generally U-shaped cross-section defining a void.

12. The memory cell, as set forth in claim 11, comprising a dielectric material disposed within the void of the U-shaped cross-section of the polysilicon diode.

13. The memory cell, as set forth in claim 11, wherein the grain boundaries on each side of the U-shaped cross-section of the polysilicon diode generally extend in the first direction.

14. The memory cell, as set forth in claim 9, wherein the memory element comprises a material having a resistance being alterable in response to the current flowing through the memory element and the polysilicon diode having a sufficient magnitude.

15. The memory cell, as set forth in claim 14, wherein the material comprises a chalcogenide material.

16. The memory cell, as set forth in claim 15, wherein the chalcogenide material is disposed between a first electrode and a second electrode, the first electrode being electrically coupled to the polysilicon diode.

* * * * *